(12) United States Patent
Chen et al.

(10) Patent No.: US 9,985,054 B2
(45) Date of Patent: May 29, 2018

(54) ARRAY SUBSTRATE AND DISPLAY DEVICE

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventors: Chuanbao Chen, Beijing (CN); Juncai Ma, Beijing (CN); Jie Yang, Beijing (CN)

(73) Assignees: BOE TECHNOLOGY GROUP CO., LTD., Beijing (CN); HEFEI BOE OPTOELECTRONICS TECHNOLOGY CO., LTD., Beijing (CN)

( * ) Notice: Subject to any disclaimer, the term of this patent is extended or adjusted under 35 U.S.C. 154(b) by 124 days.

(21) Appl. No.: 15/102,275

(22) PCT Filed: Sep. 21, 2015

(86) PCT No.: PCT/CN2015/090102
§ 371 (c)(1),
(2) Date: Jun. 6, 2016

(87) PCT Pub. No.: WO2016/161777
PCT Pub. Date: Oct. 13, 2016

(65) Prior Publication Data
US 2017/0133410 A1    May 11, 2017

(30) Foreign Application Priority Data
Apr. 8, 2015    (CN) .......................... 2015 1 0164507

(51) Int. Cl.
*G02F 1/136*    (2006.01)
*H01L 27/12*    (2006.01)
(Continued)

(52) U.S. Cl.
CPC ........ *H01L 27/1255* (2013.01); *G02F 1/1368* (2013.01); *G02F 1/13454* (2013.01);
(Continued)

(58) Field of Classification Search
CPC ........... H01L 27/1255; G02F 1/136286; G02F 1/133514; G02F 1/13454; G02F 1/1368; G02F 1/133345; G02F 2001/136295
(Continued)

(56) References Cited

U.S. PATENT DOCUMENTS

2004/0256966 A1    12/2004  Su et al.
2008/0192163 A1*   8/2008  Lee .................. G02F 1/136286
                                                              349/46
2010/0328563 A1    12/2010  Chang et al.

FOREIGN PATENT DOCUMENTS

CN    1360296 A    7/2002
CN    102053434 A   5/2011
(Continued)

OTHER PUBLICATIONS

International Search Report and Written Opinion (including English translation) dated Jan. 18, 2016, for corresponding PCT Application No. PCT/CN2015/090102.
(Continued)

*Primary Examiner* — Charles Chang
(74) *Attorney, Agent, or Firm* — Kinney & Lange, P.A.

(57) ABSTRACT

The present disclosure provides an array substrate and a display device that can suppress the adverse effects in display due to difference in gray-scale luminance of adjacent two rows caused by variation in capacitance of adjacent two rows of TFTs as the result of displacement of the data lines. Scan lines and data lines crossing each other are arranged on the array substrate. Each row of the scan lines is provided with a gate driver circuit, wherein each row of the scan lines
(Continued)

is further provided with a compensation capacitor connected to the gate driver circuit, the compensation capacitor including a first metal layer and a second metal layer that are overlapped with each other to form an overlap region at which the first metal layer is isolated from the second metal layer by an insulation layer, wherein the compensation capacitor in an $N^{th}$ row has a capacitance that changes in a direction opposite to the direction in which the capacitance of the compensation capacitor in an $N+1^{th}$ row changes, and the compensation capacitor in the $N^{th}$ row has a capacitance that changes in the same direction as the direction in which the capacitance of a thin film transistor capacitor in the $N+1^{th}$ row changes, where N is a natural number greater than or equal to 1.

20 Claims, 3 Drawing Sheets

(51) Int. Cl.
| | | |
|---|---|---|
| *G02F 1/1362* | | (2006.01) |
| *G02F 1/1335* | | (2006.01) |
| *G02F 1/1345* | | (2006.01) |
| *G02F 1/1368* | | (2006.01) |
| *G02F 1/1333* | | (2006.01) |

(52) U.S. Cl.
CPC .. *G02F 1/133345* (2013.01); *G02F 1/133514* (2013.01); *G02F 1/136286* (2013.01); *G02F 2001/136295* (2013.01)

(58) Field of Classification Search
USPC .................................................. 349/42–43
See application file for complete search history.

(56) References Cited

FOREIGN PATENT DOCUMENTS

| | | |
|---|---|---|
| CN | 103941507 A | 7/2014 |
| CN | 203811938 U | 9/2014 |
| CN | 104090436 A | 10/2014 |
| CN | 104730792 A | 6/2015 |
| JP | 2002277893 A | 9/2002 |
| JP | 2005055461 A | 3/2005 |

OTHER PUBLICATIONS

First Chinese Office Action, for Chinese Patent Application No. 201510164507.5, dated Mar. 3, 2017, 6 pages.

\* cited by examiner

ARRAY SUBSTRATE AND DISPLAY DEVICE

CROSS-REFERENCE TO RELATED APPLICATION

This application claims benefit of Chinese Application No. 201510164507.5, titled "An array substrate and display device" filed with SIPO on Apr. 8, 2015, which is incorporated herein by reference in their entirety.

BACKGROUND OF THE INVENTION

Field of the Invention

The present disclosure relates to the field of technology of liquid crystal display, and in particular, to an array substrate and a display device.

Description of the Related Art

A liquid crystal display includes an array substrate and a color filter substrate arranged to be opposed to each other. The array substrate is provided with scan lines and data lines crossing each other thereon. The scan lines and the data lines are arranged to encircle pixel units respectively. A TFT (thin film transistor) and a pixel electrode are arranged within each of the pixel units. FIG. 1a is a schematic view showing a structure of an array substrate in the prior art. In the liquid crystal display, during display operation, the scan lines are scanned one row by one row. One of the scan lines controls the row of thin film transistors by a gate driver circuit (GOA, Gate On Array) in the row to further control one row of pixel electrodes. When one of the scan lines is scanned, the thin film transistor controlled by the one of the scan lines is activated, so as to transmit respective data voltages on the data lines to the pixel electrodes to charge the pixel electrodes. After the scan ends, the thin film transistor is switched off.

As high resolution gate driver circuit products develop, density of pixels becomes increased. It means that the power consumption of the products becomes increased while a high definition picture is displayed. In order to reduce power consumption of the products, a pixel TFT array uses a Z-inverse mode. However, for the high resolution products, the pixel TFT has a smaller size. If the data lines and the scan lines are displaced, for example, as shown in FIG. 1b, a capacitance of a capacitor between adjacent two rows of pixel TFTs (a capacitor between the data lines and the scan lines) will vary. Variation of the capacitance between adjacent two rows may cause delay of signals of adjacent two scan lines to change and thus cause jumping voltages to change. Such change may lead to difference in gray-scale luminance of adjacent two rows.

SUMMARY

An embodiment of the present invention provides an array substrate on which scan lines and data lines crossing each other are arranged, each row of the scan lines being provided with a gate driver circuit, wherein each row of the scan lines is further provided with a compensation capacitor connected to the gate driver circuit, the compensation capacitor including a first metal layer and a second metal layer that are overlapped with each other to form an overlap region at which the first metal layer is isolated from the second metal layer by an insulation layer, wherein the compensation capacitor in an $N^{th}$ row has a capacitance that changes in a direction opposite to the direction in which the capacitance of the compensation capacitor in an $N+1^{th}$ row changes, and the compensation capacitor in the $N^{th}$ row has a capacitance that changes in the same direction as the direction in which the capacitance of a thin film transistor capacitor in the $N+1^{th}$ row changes, where N is a natural number greater than or equal to 1.

An embodiment of the present invention provides a display device, and it includes the array substrate described in any of the above embodiments and a color filter substrate that are opposed to each other and assembled.

BRIEF DESCRIPTION OF THE DRAWINGS

Figures given herein are intended to further explain the present disclosure to form part of the present disclosure. The exemplary embodiments of the present invention and description thereof are intended to explain the present disclosure, instead of limiting the present invention. In the figures.

DETAILED DESCRIPTION OF PREFERRED EMBODIMENTS OF THE INVENTION

In order to reduce variation in capacitance of a capacitor between adjacent two rows due to displacement of data lines so as to suppress the adverse effects in display caused by the difference in gray-scale luminance of adjacent two rows, an embodiment of the present invention provides an array substrate and a display device.

The embodiments of the present invention will be further explained below with reference to the figures. It should be understood that the embodiments described herein are only intended to describe and explain the present disclosure, instead of limiting the present invention. The embodiments and features in the embodiments in the present invention may be combined unless they are conflicted with each other.

Other features and advantages of the present disclosure will be explained below and become apparent in part from the description, or become known by implementing the embodiments of the present invention. Objects and other advantages of the present disclosure may be taken and attained by structures described specifically in the description, claims and drawings.

Figure 1A:
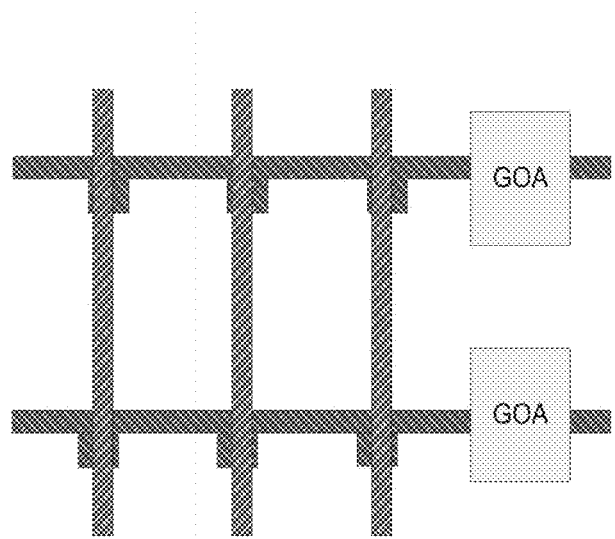
FIG. 1a is a schematic view showing a structure of an array substrate in the prior art.
Figure 1B:
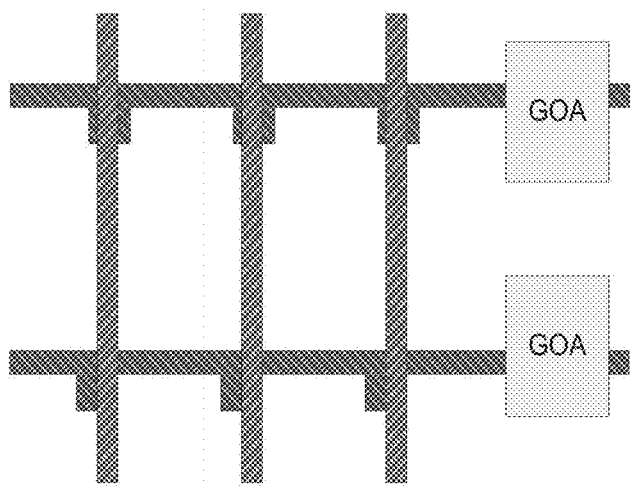
FIG. 1b is a schematic view showing a structure of an array substrate in which data lines have been displaced to the right in the prior art.
Figure 2:
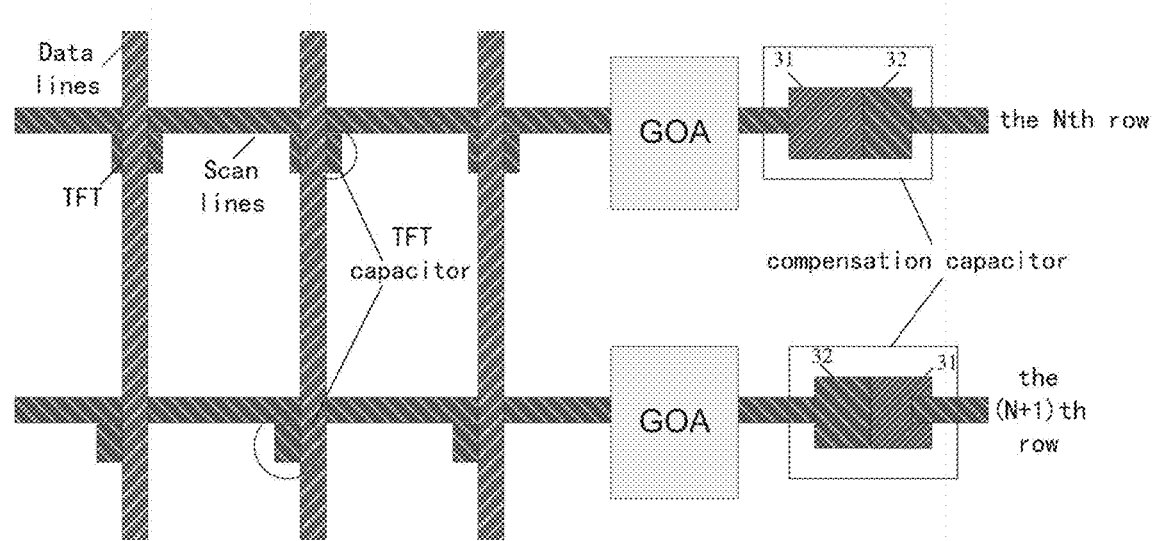
FIG. 2 is a schematic view showing a structure of a first array substrate according to an embodiment of the present invention, in which for brevity, an overlap region for a first metal layer and a second metal layer is not shown.
Figure 3:
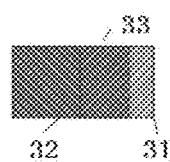
FIG. 3 is a schematic view showing a structure of a compensation capacitor according to an embodiment of the present invention.

FIG. 2 is a schematic view showing a structure of a first array substrate according to an embodiment of the present invention. The scan lines and data lines crossing each other are arranged on the array substrate provided by the embodiment of the present invention. Each row of the scan lines is provided with a gate driver circuit (GOA) and each row of the scan lines is further provided with a compensation capacitor connected to the gate driver circuit in the row. FIG. 3 is a schematic view showing a structure of the compensation capacitor. The compensation capacitor includes a first metal layer 31 and a second metal layer 32 that are overlapped with each other to form an overlap region 33. At the overlap region 33, the first metal layer 31 is isolated from the second metal layer 32 by an insulation layer.

In an embodiment, the overlap region may be designed to have any shape. The shape of the overlap region is not limited in embodiments of the present invention. As an example, for convenience in producing process, the first metal layer 31, the second metal layer 32 and the overlap region 33 may be in a shape of rectangle. In an example, the rectangle may have a side parallel to the data lines. In this way, the compensation capacitor may be controlled more accurately and the compensation effects may be improved.

In an embodiment, the first metal layer 31 may be made of the same metal material as that of the scan lines and the second metal layer 32 may be made of the same metal material as that of the data lines. In an example, the compensation capacitor in the $N^{th}$ row of scan line has a capacitance that changes in a direction opposite to the direction in which the capacitance of the compensation capacitor in the $N+1^{th}$ row of scan line changes, and the compensation capacitor in the $N^{th}$ row of scan line has a capacitance that changes in the same direction as the direction in which the capacitance of a thin film transistor capacitor corresponding to the $N+1^{th}$ row of scan line changes, where N is a natural number greater than or equal to 1. For the sake of convenience, the term "compensation capacitor in the $N^{th}$ row of scan line" will be called as "compensation capacitor in the $N^{th}$ row" and the term "thin film transistor capacitor corresponding to the $N^{th}$ row of scan line" will be called as "thin film transistor capacitor in the $N^{th}$ row", below.

An area of the overlap region 33 of the first metal layer 31 and the second metal layer 32 is in direct proportion to the capacitance of the compensation capacitor. The larger the area of the overlap region 33 is, the larger the capacitance of the compensation capacitor becomes. In contrast, the smaller the area of the overlap region 33 is, the smaller the capacitance of the compensation capacitor becomes. Thus, in the embodiment of the present invention, control of the capacitance of the compensation capacitor may be achieved by controlling the overlapped area between the first metal layer 31 and the second metal layer 32.

In an embodiment, arrangement in positions of non-overlap regions of the first metal layer and the second metal layer composing the compensation capacitor in the $N^{th}$ row with respect to the overlap region is opposite to arrangement in positions of non-overlap regions of the first metal layer and the second metal layer composing the compensation capacitor in the $N+1^{th}$ row with respect to the overlap region. In particular, as shown in FIG. 2, the non-overlap region of the first metal layer 31 of the compensation capacitor in the $N^{th}$ row is located at the left side of the overlap region 33 (not shown in FIG. 2, please see FIG. 3). The non-overlap region of the second metal layer 32 of the compensation capacitor in the $N^{th}$ row is located at the right side of the overlap region 33. The non-overlap region of the first metal layer 31 of the compensation capacitor in the $N+1^{th}$ row is located at the right side of the overlap region 33. The non-overlap region of the second metal layer 32 of the compensation capacitor in the $N^{th}$ row is located at the left side of the overlap region 33.

Taking the array substrate illustrated in FIG. 2 as an example, if the data lines are displaced to the right with respect to the scan lines and the capacitance of the thin film transistor capacitor in the $N^{th}$ row is reduced, then the capacitance of the thin film transistor capacitor in the $N+1^{th}$ row increases. In order that the total capacitance of the $N^{th}$ row is substantially equal to the total capacitance of the $N+1^{th}$ row, the capacitance of the compensation capacitor in the $N^{th}$ row should be increased (the direction in which the capacitance of the compensation capacitor in the $N^{th}$ row changes is the same as the direction in which the capacitance of the TFT capacitor in the $N+1^{th}$ row changes), that is, the overlap area of the first metal layer 31 and the second metal layer 32 should increase, while the capacitance of the compensation capacitor in the $N+1^{th}$ row should be reduced (the direction in which the capacitance of the compensation capacitor in the $N+1^{th}$ row changes is opposite to the direction in which the capacitance of the compensation capacitor in the $N^{th}$ row changes), that is, the overlap area of the first metal layer 31 and the second metal layer 32 should be reduced. When the data lines are displaced to the right with respect to the scan lines, the first metal layer 31 made of the same material as that of the scan lines is also displaced to the right with respect to the scan lines. For the $N^{th}$ row, thus, in order to ensure the overlap area of the first metal layer 31 and the second metal layer 32 increases when the first metal layer 31 is displaced to the right with respect to the scan lines, the non-overlap region of the first metal layer 31 is located on a left side of the overlap region and the non-overlap region of the second metal layer 32 is located on a right side of the overlap region. For the $N+1^{th}$ row, thus, in order to ensure the overlap area of the first metal layer 31 and the second metal layer 32 is reduced when the first metal layer 31 is displaced to the right with respect to the scan lines, the non-overlap region of the first metal layer 31 is located on the right side of the overlap region and the non-overlap region of the second metal layer 32 is located on the left side of the overlap region.

Similarly, if the data lines are displaced to the right with respect to the scan lines and the capacitance of the thin film transistor capacitor in the $N^{th}$ row increases and the capacitance of the thin film transistor capacitor in the $N+1^{th}$ row is reduced. In order that the total capacitance of the $N^{th}$ row is substantially equal to the total capacitance of the $N+1^{th}$ row, the capacitance of the compensation capacitor in the $N^{th}$ row should be reduced (the direction in which the capacitance of the compensation capacitor in the $N^{th}$ row changes is the same as the direction in which the capacitance of the TFT capacitor in the $N+1^{th}$ row changes), that is, the overlap area of the first metal layer 31 and the second metal layer 32 should be reduced, while the capacitance of the compensation capacitor in the $N+1^{th}$ row should increase (the direction in which the capacitance of the compensation capacitor in the $N+1^{th}$ row changes is opposite to the direction in which the capacitance of the compensation capacitor in the $N^{th}$ row changes), that is, the overlap area of the first metal layer 31 and the second metal layer 32 should increase. When the data lines are displaced to the right with respect to the scan lines, the metal layer 31 made of the same material as that of the scan lines is also displaced to the right with respect to the scan lines. For the $N^{th}$ row, thus, in order to ensure the overlap area of the first metal layer 31 and the second metal layer 32 increases when the first metal layer 31 is displaced to the right with respect to the scan lines, the non-overlap region of the first metal layer 31 is located on a right side of the overlap region and the non-overlap region of the second metal layer 32 is located on a left side of the overlap region. For the $N+1^{th}$ row, thus, in order to ensure the overlap area of the first metal layer 31 and the second metal layer 32 increases when the first metal layer 31 is displaced to the right with respect to the scan lines, the non-overlap region of the first metal layer 31 is located on the left side of the overlap region and the non-overlap region of the second metal layer 32 is located on the right side of the overlap region.

Correspondingly, if the data lines are displaced to the left relative to the scan lines and the capacitance of the thin film transistor capacitor in the $N^{th}$ row is reduced and the capacitance of the thin film transistor capacitor in the $N+1^{th}$ row increases. In order that the total capacitance of the $N^{th}$ row is substantially equal to the total capacitance of the $N+1^{th}$ row, the capacitance of the compensation capacitor in the $N^{th}$ row should increase (the direction in which the capacitance of the compensation capacitor in the $N^{th}$ row changes is the same as the direction in which the capacitance of the TFT capacitor in the $N+1^{th}$ row changes), that is, the overlap area of the first metal layer 31 and the second metal layer 32 should increase, while the capacitance of the compensation capacitor in the $N+1^{th}$ row should be reduced (the direction in which the capacitance of the compensation capacitor in the $N+1^{th}$ row changes is opposite to the direction in which the capacitance of the compensation capacitor in the $N^{th}$ row changes), that is, the overlap area of the first metal layer 31 and the second metal layer 32 should be reduced. When the data lines are displaced to the left with respect to the scan lines, the metal layer 31 made of the same material as that of the scan lines is also displaced to the left with respect to the scan lines. For the $N^{th}$ row, thus, in order to ensure the overlap area of the first metal layer 31 and the second metal layer 32 increases when the first metal layer 31 is displaced to the left with respect to the scan lines, the non-overlap region of the first metal layer 31 is located on a right side of the overlap region and the non-overlap region of the second metal layer 32 is located on a left side of the overlap region. For the $N+1^{th}$ row, thus, in order to ensure the overlap area of the first metal layer 31 and the second metal layer 32 is reduced when the first metal layer 31 is displaced to the left with respect to the scan lines, the non-overlap region of the first metal layer 31 is located on the left side of the overlap region and the non-overlap region of the second metal layer 32 is located on the right side of the overlap region.

As such, if the data lines are displaced to the left with respect to the scan lines and the capacitance of the thin film transistor capacitor in the $N^{th}$ row increases and the capacitance of the thin film transistor capacitor in the $N+1^{th}$ row is reduced. In order that the total capacitance of the $N^{th}$ row is substantially equal to the total capacitance of the $N+1^{th}$ row, the capacitance of the compensation capacitor in the $N^{th}$ row should be reduced (the direction in which the capacitance of the compensation capacitor in the $N^{th}$ row changes is the same as the direction in which the capacitance of the TFT capacitor in the $N+1^{th}$ row changes), that is, the overlap area of the first metal layer 31 and the second metal layer 32 should be reduced, while the capacitance of the compensation capacitor in the $N+1^{th}$ row should increase (the direction in which the capacitance of the compensation capacitor in the $N+1^{th}$ row changes is opposite to the direction in which the capacitance of the compensation capacitor in the $N^{th}$ row changes), that is, the overlap area of the first metal layer 31 and the second metal layer 32 should increase. When the data lines are displaced to the left with respect to the scan lines, the first metal layer 31 made of the same material as that of the scan lines is also displaced to the left with respect to the scan lines. For the $N^{th}$ row, thus, in order to ensure the overlap area of the first metal layer 31 and the second metal layer 32 is reduced when the first metal layer 31 is displaced to the left with respect to the scan lines, the non-overlap region of the first metal layer 31 is located on a left side of the overlap region and the non-overlap region of the second metal layer 32 is located on a right side of the overlap region. For the $N+1^{th}$ row, thus, in order to ensure the overlap area of the first metal layer 31 and the second metal layer 32 increases when the first metal layer 31 is displaced to the left with respect to the scan lines, the non-overlap region of the first metal layer 31 is located on the right side of the overlap region and the non-overlap region of the second metal layer 32 is located on the left side of the overlap region.

In an embodiment, in the array substrate, the compensation capacitor may be arranged at an input end of the gate driver circuit, i.e., as indicated in FIG. 2 as a schematic view of the structure of the array substrate. In the embodiment, one end of the compensation capacitor is connected to the input end of the gate driver circuit, while the other end is connected to a display region.

Figure 4:
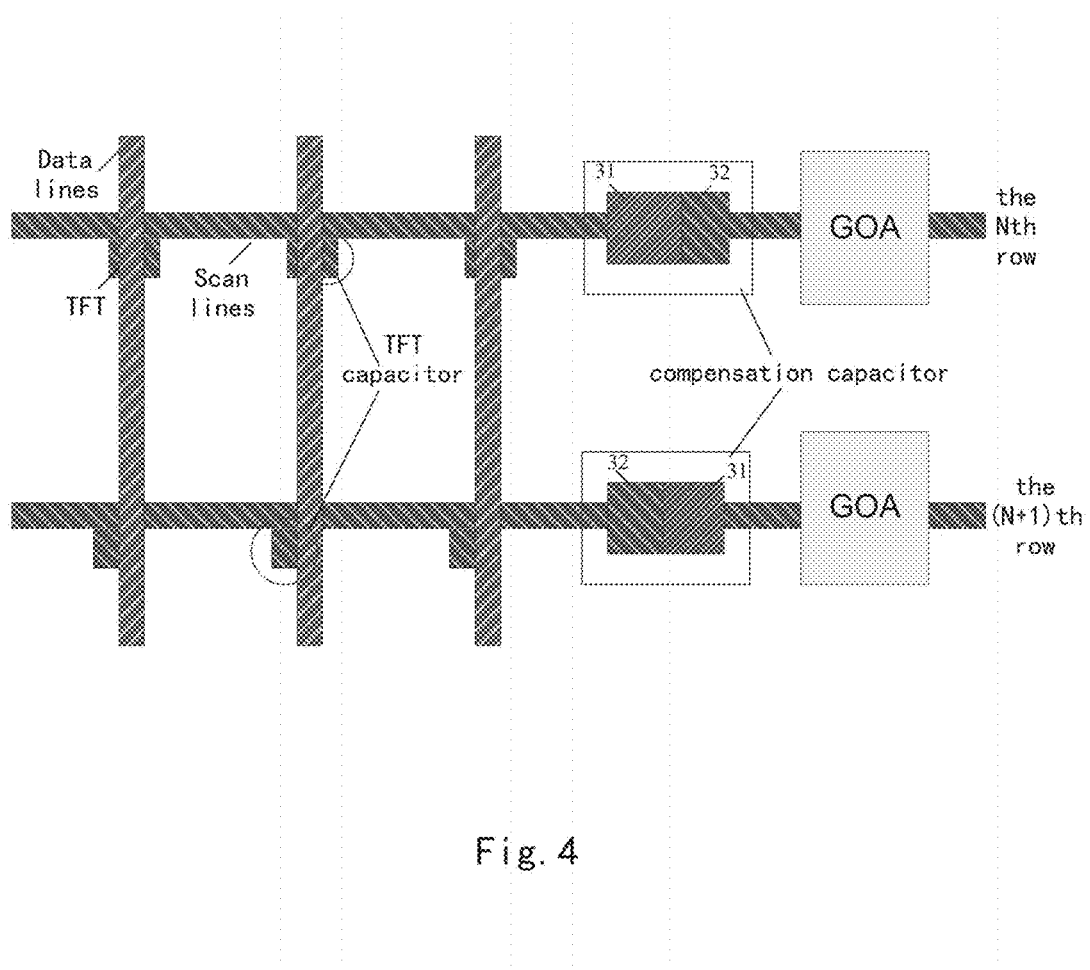
FIG. 4 is a schematic view showing a structure of a second array substrate according to an embodiment of the present invention, in which for brevity, an overlap region for a first metal layer and a second metal layer is not shown.

Alternatively, the compensation capacitor may be arranged at an output end of the gate driver circuit, illustrated in FIG. 4. In the embodiment, one end of the compensation capacitor is connected to the output end of the gate driver circuit, while the other end is connected to a control signal terminal.

The array substrate provided by an embodiment of the present invention may adjust the capacitance of the compensation capacitor by providing a compensation capacitor at the input end or the output end of the gate driver circuit in each row and by controlling the relative position of the first metal layer and the second metal layer composing the compensation capacitor. The capacitance of the compensation capacitor varies in the direction opposite to the direction in which the capacitance of the TFT capacitor in the same row varies. The capacitance of the compensation capacitor varies in the same direction as the direction in which the capacitance of the TFT capacitor in the adjacent row varies. And the capacitance of the compensation capacitor varies in the direction opposite to the direction in which the capacitance of the compensation capacitor in the adjacent row varies. In this way, when the data lines are displaced, the difference in gray-scale between adjacent rows may be reduced by adjusting the total capacitance of the adjacent rows to be substantially equal by the compensation capacitor, so as to avoid adverse effects in display such as non-uniformity in display picture, flicker.

Based on the same concept, an embodiment of the present invention also provides a display device including the array substrate as described in any one of the above embodiments and a color filter substrate that are opposed to each other and assembled.

In the array substrate and the display device provided by an embodiment of the present invention, a compensation capacitor connected to the gate driver circuit is provided on each row of the scan lines. The capacitance of the compensation capacitor in the $N^{th}$ row varies in the direction opposite to the direction in which the capacitance of the compensation capacitor in the $N+1^{th}$ row varies. The capacitance of the compensation capacitor in the $N^{th}$ row varies in the same direction as the direction in which the capacitance of the TFT capacitor in the $N+1^{th}$ row varies. In this way, when the data lines are displaced, the variation in the capacitance of the TFT capacitor in the $N^{th}$ row is equal to the variation in the capacitance of the TFT capacitor in the $N+1^{th}$ row and the capacitance of the TFT capacitor in the $N^{th}$ row varies in the direction opposite to the direction in which the capacitance of the TFT capacitor in the $N+1^{th}$ row varies and the capacitance of the compensation capacitor in the $N^{th}$ row varies in the same direction as the direction in which the capacitance of the TFT capacitor in the $N+1^{th}$ row varies. Thus, the capacitance of the compensation capacitor may be adjusted to make the total capacitances in adjacent two rows substantially equal to each other, so as to suppress adverse effects in display due to difference in gray-scale luminance caused by difference in capacitances of adjacent two rows.

Although the above embodiments of the present invention have been described, the skilled person in the art may envisage further modifications and variations to these embodiments from the basis inventive concept. Therefore, the appended claims are intended to cover embodiments and all of variations and modifications within the scope of the present invention.

Obviously, the skilled person in the art can alter and modify the present disclosure variously without departing from the spirit and scope of the present invention. Thus, various alternations and modifications will also fall within the scope of the present invention if they belong to the scope defined by claims or equivalents thereof.

What is claimed is:

1. An array substrate on which scan lines and data lines crossing each other are arranged, each row of the scan lines being provided with a gate driver circuit, wherein
   each row of the scan lines is further provided with a compensation capacitor connected to the gate driver circuit, the compensation capacitor including a first metal layer and a second metal layer that are overlapped with each other to form an overlap region at which the first metal layer is isolated from the second metal layer by an insulation layer,
   wherein the compensation capacitor in an $N^{th}$ row has a capacitance that changes in a direction opposite to the direction in which the capacitance of the compensation capacitor in an $N+1^{th}$ row changes, and the compensation capacitor in the $N^{th}$ row has a capacitance that changes in a same direction as the direction in which the capacitance of a thin film transistor capacitor in the $N+1^{th}$ row changes, and the compensation capacitor in the $N^{th}$ row has a capacitance that changes in a direction opposite to the direction in which the capacitance of the thin film transistor capacitor in the $N^{th}$ row changes, where N is a natural number greater than or equal to 1.

2. The array substrate according to claim 1, wherein the overlap region has a shape of rectangle.

3. The array substrate according to claim 2, wherein the rectangle has a side parallel to the data lines.

4. The array substrate according to claim 2, wherein the first metal layer is made of a same metal material as that of the scan lines and the second metal layer is made of a same metal material as that of the data lines.

5. The array substrate according to claim 4, wherein if the data lines are displaced to the right with respect to the scan lines and the capacitance of the thin film transistor capacitor in the Nth row is reduced, the non-overlap region of the first metal layer of the compensation capacitor in the Nth row will be located on a left side of the overlap region, the non-overlap region of the second metal layer of the compensation capacitor in the Nth row will be located on a right side of the overlap region, the non-overlap region of the first metal layer of the compensation capacitor in the N+1th row will be located on a right side of the overlap region, and the non-overlap region of the second metal layer of the compensation capacitor in the N+1th row will be located on a left side of the overlap region.

6. The array substrate according to claim 4, wherein if the data lines are displaced to the right with respect to the scan lines and the capacitance of the thin film transistor capacitor in the Nth row is increased, the non-overlap region of the first metal layer of the compensation capacitor in the Nth row will be located on a right side of the overlap region, the non-overlap region of the second metal layer of the compensation capacitor in the Nth row will be located on a left side of the overlap region, the non-overlap region of the first metal layer of the compensation capacitor in the N+1th row will be located on a left side of the overlap region, and the non-overlap region of the second metal layer of the compensation capacitor in the N+1th row will be located on a right side of the overlap region.

7. The array substrate according to claim 4, wherein if the data lines are displaced to the left with respect to the scan lines and the capacitance of the thin film transistor capacitor in the Nth row is reduced, the non-overlap region of the first metal layer of the compensation capacitor in the Nth row will be located on a right side of the overlap region, the non-overlap region of the second metal layer of the compensation capacitor in the Nth row will be located on a left side of the overlap region, the non-overlap region of the first metal layer of the compensation capacitor in the N+1th row will be located on a left side of the overlap region, and the non-overlap region of the second metal layer of the compensation capacitor in the N+1th row will be located on a right side of the overlap region.

8. The array substrate according to claim 4, wherein if the data lines are displaced to the left with respect to the scan lines and the capacitance of the thin film transistor capacitor in the Nth row is increased, the non-overlap region of the first metal layer of the compensation capacitor in the Nth row will be located on a left side of the overlap region, the non-overlap region of the second metal layer of the compensation capacitor in the Nth row will be located on a right side of the overlap region, the non-overlap region of the first metal layer of the compensation capacitor in the N+1th row will be located on a right side of the overlap region, and the non-overlap region of the second metal layer of the compensation capacitor in the N+1th row will be located on a left side of the overlap region.

9. The array substrate according to claim 3, wherein the first metal layer is made of a same metal material as that of the scan lines and the second metal layer is made of a same metal material as that of the data lines.

10. A display device, comprising the array substrate according to claim 2 and a color filter substrate that are opposed to each other and assembled.

11. The array substrate according to claim 1, wherein arrangement in positions of non-overlap regions of the first metal layer and the second metal layer composing the compensation capacitor in the $N^{th}$ row with respect to the overlap region is opposite to arrangement in positions of non-overlap regions of the first metal layer and the second metal layer composing the compensation capacitor in the $N+1^{th}$ row with respect to the overlap region.

12. The array substrate according to claim 11, wherein the first metal layer is made of a same metal material as that of the scan lines and the second metal layer is made of a same metal material as that of the data lines.

13. The array substrate according to claim 1, wherein the compensation capacitor is arranged at an input end or an output end of the gate driver circuit.

14. The array substrate according to claim 13, wherein the first metal layer is made of a same metal material as that of the scan lines and the second metal layer is made of a same metal material as that of the data lines.

15. The array substrate according claim 1, wherein the first metal layer is made of a same metal material as that of the scan lines and the second metal layer is made of a same metal material as that of the data lines.

16. The array substrate according to claim 15, wherein if the data lines are displaced to the right with respect to the scan lines and the capacitance of the thin film transistor capacitor in the $N^{th}$ row is reduced, the non-overlap region of the first metal layer of the compensation capacitor in the $N^{th}$ row will be located on a left side of the overlap region, the non-overlap region of the second metal layer of the compensation capacitor in the $N^{th}$ row will be located on a right side of the overlap region, the non-overlap region of the first metal layer of the compensation capacitor in the $N+1^{th}$ row will be located on a right side of the overlap region, and the non-overlap region of the second metal layer of the compensation capacitor in the $N+1^{th}$ row will be located on a left side of the overlap region.

17. The array substrate according to claim 15, wherein if the data lines are displaced to the right with respect to the scan lines and the capacitance of the thin film transistor capacitor in the $N^{th}$ row is increased, the non-overlap region of the first metal layer of the compensation capacitor in the $N^{th}$ row will be located on a right side of the overlap region, the non-overlap region of the second metal layer of the compensation capacitor in the $N^{th}$ row will be located on a left side of the overlap region, the non-overlap region of the first metal layer of the compensation capacitor in the $N+1^{th}$ row will be located on a left side of the overlap region, and the non-overlap region of the second metal layer of the compensation capacitor in the $N+1^{th}$ row will be located on a right side of the overlap region.

18. The array substrate according to claim 15, wherein if the data lines are displaced to the left with respect to the scan lines and the capacitance of the thin film transistor capacitor in the $N^{th}$ row is reduced, the non-overlap region of the first metal layer of the compensation capacitor in the $N^{th}$ row will be located on a right side of the overlap region, the non-overlap region of the second metal layer of the compensation capacitor in the $N^{th}$ row will be located on a left side of the overlap region, the non-overlap region of the first metal layer of the compensation capacitor in the $N+1^{th}$ row will be located on a left side of the overlap region, and the non-overlap region of the second metal layer of the compensation capacitor in the $N+1^{th}$ row will be located on a right side of the overlap region.

19. The array substrate according to claim 15, wherein if the data lines are displaced to the left with respect to the scan lines and the capacitance of the thin film transistor capacitor in the $N^{th}$ row is increased, the non-overlap region of the first metal layer of the compensation capacitor in the $N^{th}$ row will be located on a left side of the overlap region, the non-overlap region of the second metal layer of the compensation capacitor in the $N^{th}$ row will be located on a right side of the overlap region, the non-overlap region of the first metal layer of the compensation capacitor in the $N+1^{th}$ row will be located on a right side of the overlap region, and the non-overlap region of the second metal layer of the compensation capacitor in the $N+1^{th}$ row will be located on a left side of the overlap region.

20. A display device, comprising the array substrate according to claim 1 and a color filter substrate that are opposed to each other and assembled.

* * * * *